United States Patent
Higashi et al.

(10) Patent No.: US 8,749,012 B2
(45) Date of Patent: Jun. 10, 2014

(54) METHODS AND STRUCTURES FOR DISCHARGING PLASMA FORMED DURING THE FABRICATION OF SEMICONDUCTOR DEVICE

(75) Inventors: Masahiko Higashi, Fukushima-Ken (JP); Naoki Takeguchi, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 1196 days.

(21) Appl. No.: 12/004,969

(22) Filed: Dec. 20, 2007

(65) Prior Publication Data

US 2009/0026570 A1 Jan. 29, 2009

(30) Foreign Application Priority Data

Dec. 27, 2006 (JP) .................................. 2006/353414

(51) Int. Cl.
 *H01L 31/058* (2006.01)

(52) U.S. Cl.
 USPC ........... 257/467; 257/302; 257/306; 257/321; 257/324

(58) Field of Classification Search
 CPC ... H01L 27/24; H01L 27/112; H01L 27/1026; H01L 27/222
 USPC ........................... 257/209, 467, 529, E23.149
 See application file for complete search history.

(56) References Cited

U.S. PATENT DOCUMENTS

| | | | | |
|---|---|---|---|---|
| 6,661,330 | B1 * | 12/2003 | Young ........................... | 337/297 |
| 2002/0192879 | A1 * | 12/2002 | Tsui .............................. | 438/132 |
| 2006/0131575 | A1 * | 6/2006 | Okuno .......................... | 257/48 |
| 2007/0252237 | A1 * | 11/2007 | Ko et al. ....................... | 257/529 |

* cited by examiner

*Primary Examiner* — Kyoung Lee

(57) ABSTRACT

Methods and structures for discharging plasma formed during the fabrication of semiconductor device are disclosed. The semiconductor device includes a wordline, a common ground line and a fuse structure for electrically coupling the wordline and the common ground line until a break signal is applied via the fuse structure.

7 Claims, 9 Drawing Sheets

METHODS AND STRUCTURES FOR DISCHARGING PLASMA FORMED DURING THE FABRICATION OF SEMICONDUCTOR DEVICE

CLAIM OF PRIORITY

This application claims priority from Japanese patent application 2006-353414 filed on Dec. 27, 2006.

FIELD OF TECHNOLOGY

The present invention relates to methods and structures for discharging plasma formed during the fabrication of semiconductor device.

BACKGROUND

In a non-volatile memory, such as a flash memory, a transistor which constitutes a memory cell has a floating gate or an insulating film which is called a charge storage layer. Data is stored by accumulating electric charges in the charge storage layer, which is based on a silicon-oxide-nitride-oxide-silicon (SONOS) structure.

U.S. Pat. No. 6,011,725 discloses an exemplary SONOS flash memory based on a virtual ground memory, which is operated by switching between a source and a drain. FIG. 1 is a top view of such a flash memory. In a semiconductor substrate 10, a bit line 12 composed of a diffusion layer is provided. The bit line 12 is extended in a lengthwise direction of FIG. 1. A word line 22 is extended in a widthwise direction. The bit line 12 and the word line 22 are respectively coupled with metal plugs 28 and 26 to connect with interconnection layers.

FIGS. 2(a) through 2(d) are cross-sectional views taken along line A-A in FIG. 1. In a P-type semiconductor substrate 10, the bit line 12 doubles as a source and a drain. An ONO film 20 is then formed on the semiconductor substrate 10. The ONO film 20 includes a tunnel oxide film 14 composed of an oxide silicon film, a trapping layer 16 composed of a nitride silicon film and a top oxide film 18 composed of an oxide silicon film. The word line 22 (e.g., polysilicon) is formed on the ONO film 20. The region of the semiconductor substrate 10 between the bit lines 12 is a channel, and the word line 22 on the channel is a gate electrode 22a.

Electric charges can be accumulated in two charge storage regions of C1 and C2 in the trapping layer 16 above the regions adjacent to the bit lines 12. FIG. 2(a) shows the state of electric charges being accumulated in the charge storage regions of C1 and C2. FIG. 2(b) and FIG. 2(c) respectively show electric charges being accumulated only in C2 located on the right side and in C1 located on the left. FIG. 2(d) shows no electric charge accumulated on either side of the charge storage regions.

The accumulation of electric charges to the trapping layer is made, if the gate electrode 22a is kept at a positive voltage and the trapping layer 16 is infused with high energy electrons energized by another voltage applied between the bit lines 12. Meanwhile, the erasure of electric charges in the trapping layer 16 is made, if the gate electrode 22a is kept at a negative voltage and the trapping layer 16 is infused with holes (e.g., of electrons and holes ionized by high energy electrons) energized by another voltage applied between the bit lines 12. By switching between the source and drain, electric charges at the right and left side of the charge storage regions can be accumulated and erased.

In a non-volatile memory having a charge storage layer, there have been cases of electric charges being accumulated in the charge storage layer during manufacturing. Electric charges may be accumulated and erased when the trapping layer 16 is infused with high energy electrons and holes between the bit lines 12 during the manufacturing of a memory device.

FIG. 3 is a cross-sectional view corresponding to a view along line B-B in FIG. 1 showing how electric charges accumulating in a charge storage layer during the manufacturing of the memory device. During the manufacturing, plasma 60 formed in the process of dry etching or plasma to plasma chemical vapor deposition (CVD) results as electric charges 62. The electric charges 62 then electrify an interconnection layer 30, the metal plug 26 and the word line 22. As the electric charges 62 try to flow from the word line 22 to the semiconductor substrate 10 via the ONO film 20, the electric charges 62 are accumulated in the trapping layer 16. The electric charges 62 may remain there even after the completion of the manufacturing stage.

The unintended trapping becomes problematic when the electric charges 62 remain in the vicinity of the center of a semiconductor substrate 10 between the bit lines 12 since the electric charges cannot be easily erased during the normal operation of the memory.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a semiconductor device comprising a wordline, a common ground line and a fuse structure for electrically coupling the wordline and the common ground line until a break signal is applied via the fuse structure.

In another embodiment described in the detailed description is directed to a semiconductor device comprising a wordline formed on a portion of a silicon substrate, an interlayer insulating film formed above the wordline and the silicon substrate, an interconnect formed above the interlayer insulating film, a metal plug formed via the interlayer insulating film for electrically coupling the interconnect layer and the wordline, and a thermal variable resistor formed via the interlayer insulating film for controlling an electrical connection between the interlayer insulating film and the silicon substrate.

As illustrated in the detailed description, other embodiments pertain to methods and structures that provide an improved dissipation of electrical charges formed during the fabrication of semiconductor chips. By using a fuse or thermally variable resistor, the embodiments provide semiconductor devices with an improved plasma dissipation technology.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments efficiently discharge electrical charges formed during the manufacturing of a semiconductor device, such as a flash memory device. By forming structures that aid the dissipation of electrical charges accrued during the formation of various layers or components of the semiconductor device to either an electrical ground or to a silicon substrate of the semiconductor device, programming errors can be reduced. This is made possible by implementing a fuse structure or a thermally variable resistor structure within the semiconductor device.

First Embodiment

Figure 1:
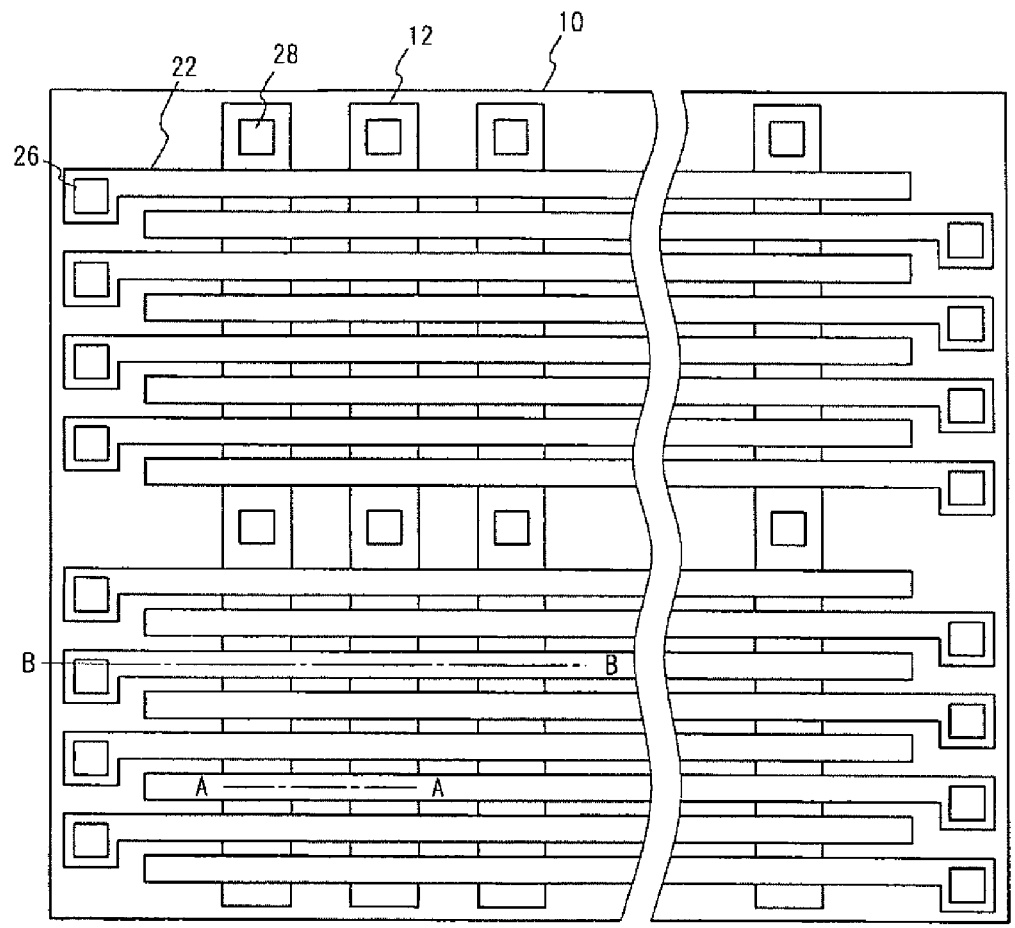
FIG. 1 is a top view of a flash memory.
Figure 2A:
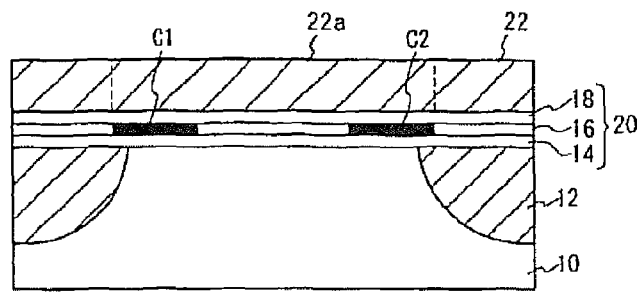
FIGS. 2(a) through 2(d) are cross-sectional views taken along line A-A in FIG. 1.
Figure 2B:
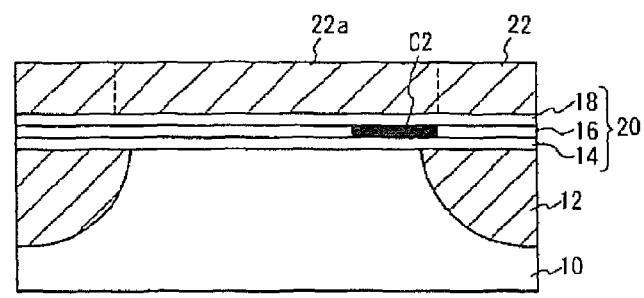
Figure 2C:
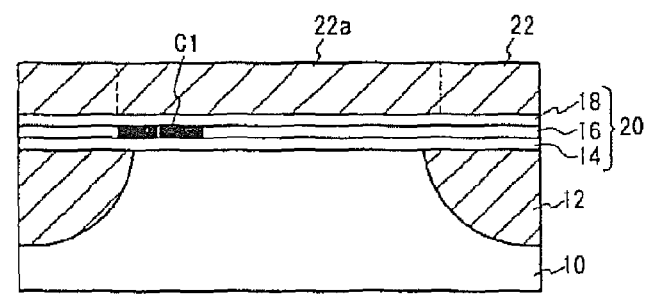
Figure 2D:
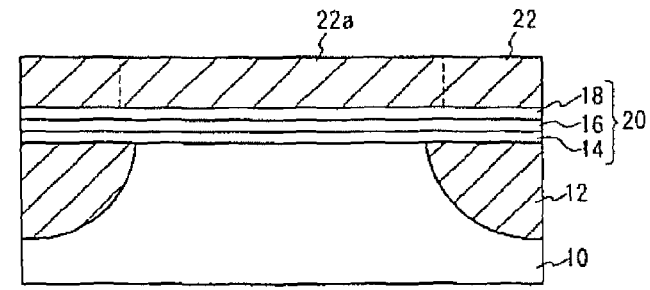
Figure 3:
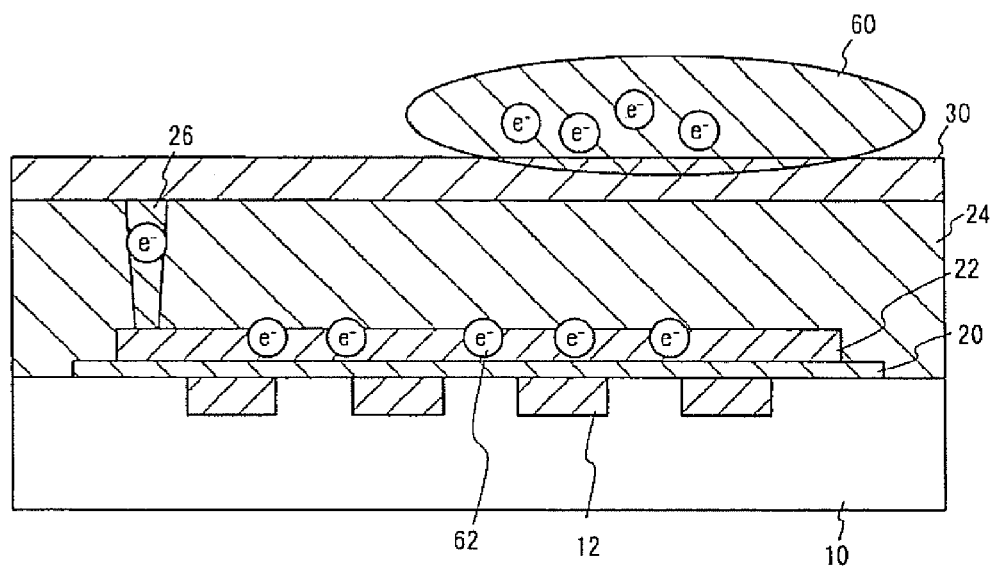
FIG. 3 is an illustration showing how electric charges are accumulated in a charge storage layer during the manufacturing.
Figure 4:
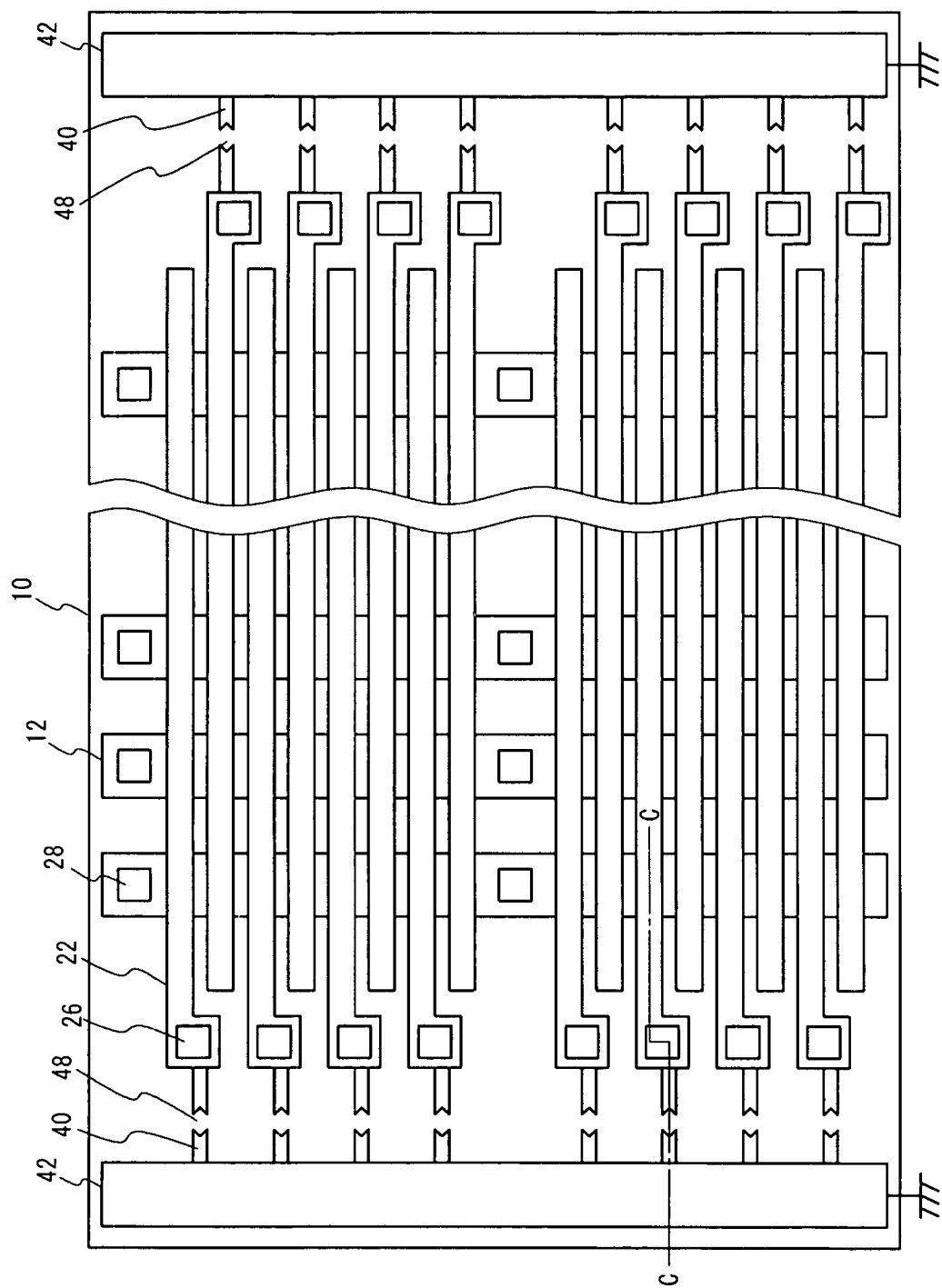
FIG. 4 is a top view of a flash memory in accordance with the first embodiment.

A first embodiment of the present invention pertains to a fuse structure that is coupled with a gate electrode during the manufacturing of a flash memory but is physically cut off when the flash memory is in use. FIG. 4 is a top view of a flash memory in accordance with the first embodiment. In FIG. 4, a fuse 40 is coupled with a word line 22 and an interconnection 42. The interconnection 42 is coupled with the semiconductor substrate 10 and is grounded. The fuse 40 is blown at a region 48.

FIGS. 5(a) through 6(b) illustrate a manufacturing process of a flash memory according to the first embodiment. The figures are cross-sectional views corresponding to a view along line C-C in FIG. 4. In reference with FIG. 5(a), the bit line 12 (e.g., N-type) is formed in the silicon semiconductor substrate 10 (e.g., P-type) by an ion implantation and a heat treatment. On the semiconductor substrate 10, the ONO film 20, a tunnel oxide film, a trapping layer, and a top oxide film are formed, a non-conductive polysilicon layer 44 with no impurities added (e.g., in a 200 nm thick film) is formed by CVD. By using exposure technologies and etching technologies, patterns for a word line 22, a fuse 40 and an interconnection 42 are formed from the polysilicon layer 44. A photoresist 58 is formed on the polysilicon layer 44 where the fuse 40 is to be formed. The photoresist 58 is used as a mask, and arsenic ions with ion energy of 50 keV and a dose amount of $5 \times 10^{15}$ cm$^{-3}$ are implanted.

Figure 5A:
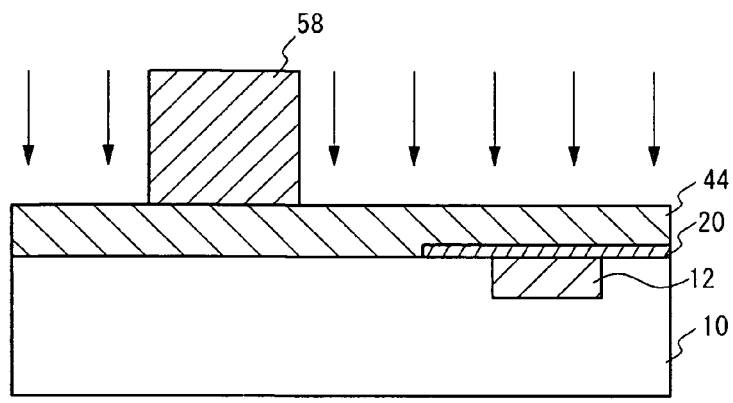
FIGS. 5(a) through 5(c) are illustrations showing a first half of a manufacturing process of the flash memory in accordance with the first embodiment.
Figure 5B:
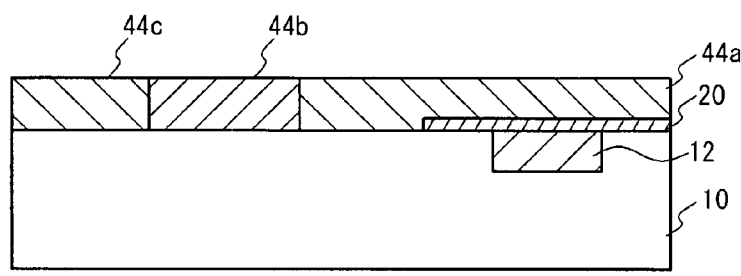
Figure 5C:
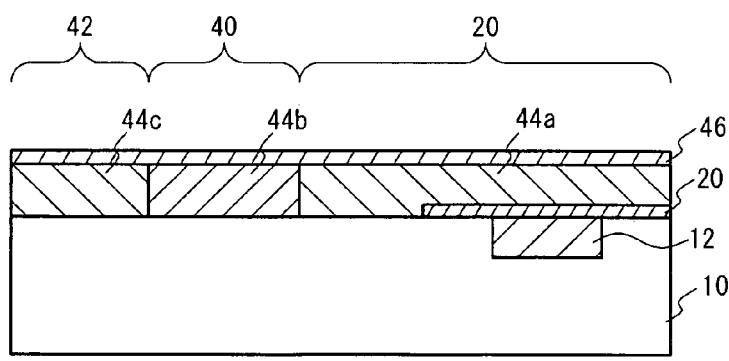

In FIG. 5(b), the photoresist 58 is removed and a heat treatment is performed afterwards. Then, the ion implanted region in the polysilicon layer 44 becomes conductive polysilicon layers 44a and 44c. Meanwhile, the region with no ion implanted becomes a non-conductive polysilicon layer 44b which is more resistive than that of conductive polysilicon layers 44a and 44c. In FIG. 5(c), a 12 nm thick metallic film (e.g., cobalt, titanium, etc.) is formed on polysilicon layers 44a, 44b and 44c using a sputtering method. Afterwards, with a heat treatment, a metal silicide layer 46 is formed. The word line 22 is formed based on the conductive polysilicon layer 44a and the metal silicide layer 46. The interconnection 42 is formed based on the conductive polysilicon layer 44c and the metal silicide layer 46. Furthermore, the fuse 40 is formed based on the non-conductive polysilicon layer 44b and the metal silicide layer 46.

Figure 6A:
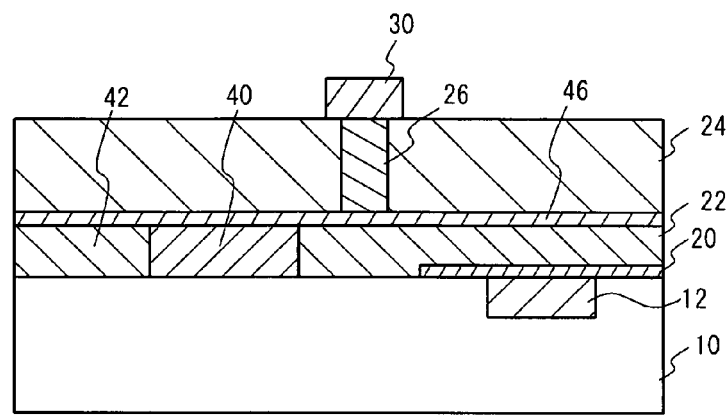
FIGS. 6(a) and 6(b) are illustrations showing a second half of the manufacturing process of the flash memory in accordance with the first embodiment.
Figure 6B:
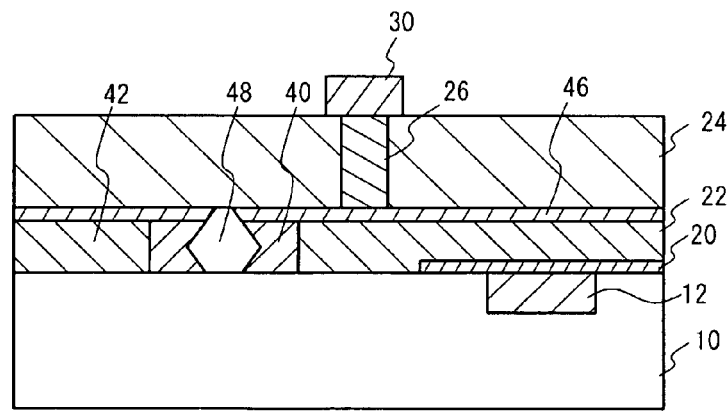

In FIG. 6(a), an interlayer insulating film 24 (e.g., an oxide silicon film) is formed above the fuse 40 and the interconnection 42, using a TEOS method. A contact hole is formed in the interlayer insulating film 24, and a metal plug 26 which is coupled with the word line 22 via the metal silicide layer 46 is formed inside the contact hole. On the interlayer insulating film 24, an interconnection layer 30 which is coupled with the metal plug 26 (e.g., aluminum) is formed. Afterwards, upper layers of interconnection layers and protection layer are formed. In FIG. 6(b), an electrical current of approximately 10 to 20 mA or a voltage of 2.5 to 5 V is applied between the interconnection layer 30 and the interconnection 42 to physically blow the fuse 40 (e.g., by creating the region 48).

In one example embodiment, the flash memory has the fuse 40 which is coupled with the word line 22 (e.g., gate electrode), and the fuse 40 is grounded to the semiconductor substrate 10 during the manufacturing process. Consequently, as illustrated in FIG. 6(a), electric charges accumulated during the formation of the interconnection layer 30 may be escaped through the fuse 40. Therefore, the accumulation of electric charges in the trapping layer 16 during the manufacturing of the flash memory can be reduced. As illustrated in FIG. 6(b), once the fuse 40 is blown, the gate electrode is isolated from the semiconductor substrate 10.

As illustrated in FIG. 6(b) in accordance with the first embodiment, the structure which connects the word line 22 and the interconnection layer 30 via the metal plug 26 allows the electric charges electrifying the word line 22 to discharge when the interconnection layer 30 is formed. The fuse 40 connected between the word line 22 and the semiconductor substrate 10 enhances the discharge process.

Furthermore, as illustrated in FIG. 5(c), the memory cell may be composed of the word line 22 (e.g., or a gate electrode) having the conductive polysilicon layer 44a, the fuse 40 having the non-conductive polysilicon layer 44b of higher resistivity than that of the conductive polysilicon layers and the metal silicide layer 46 (conductive layer) on the conductive polysilicon layer 44a and the high resistive polysilicon layer 44b. This composition allows the electric charges electrifying the word line 22 during the manufacturing to flow to the interconnection 42 through the metal silicide layer 46 above the polysilicon layer 44b of the fuse 40. The polysilicon layer 44b which constitutes the fuse 40 is of a low conductivity. Therefore, when an electrical current to blow the fuse 40 flows through it, the current rushes through the metal silicide layer 46. The sudden surge of the current causes the fuse 40 to blow. To enhance this process, more resistive material may be used to form the polysilicon layer 44b. This would allow more current to flow through the metal silicide layer 46 due to the high resistivity of the polysilicon layer 44b.

The conductive layer formed above the polysilicon layer 44 can be of any conductive materials and not limited to the metal silicide layer 46. As illustrated in FIG. 5(c), the silicidation of the upper portion of the polysilicon layer 44 helps the metal silicide layer 46 form on the polysilicon. In addition, the metal silicide layer 46 for the fuse 40 may be formed while the metal silicide layer 46 is formed on the word line 22.

Second Embodiment

Figure 7A:
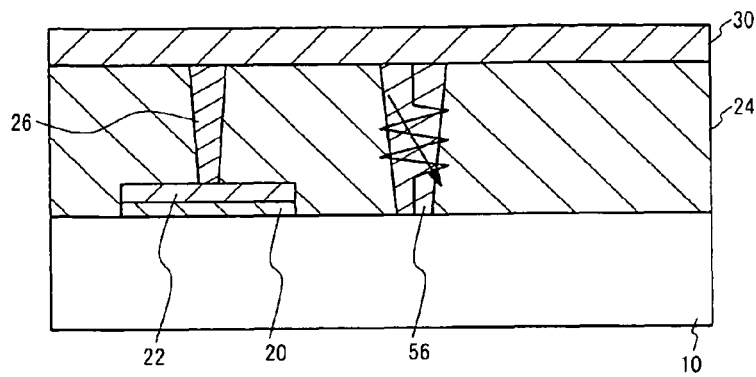
FIGS. 7(a) and 7(c) are cross-sectional views of a flash memory in accordance with the second embodiment.
Figure 7B:
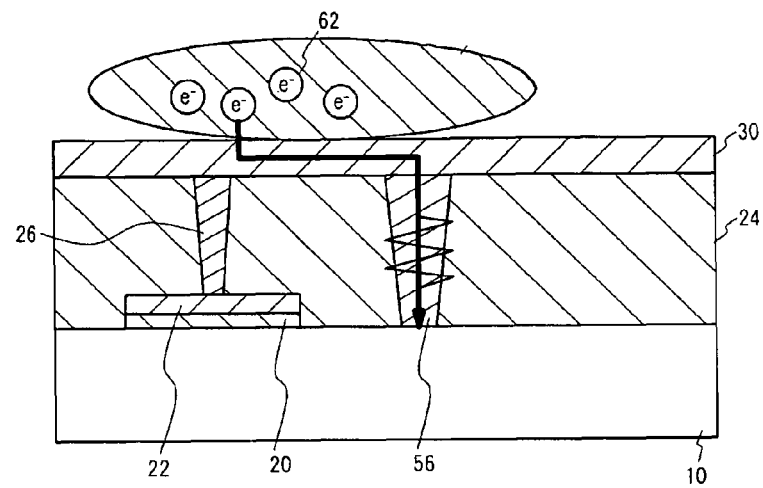
Figure 7C:
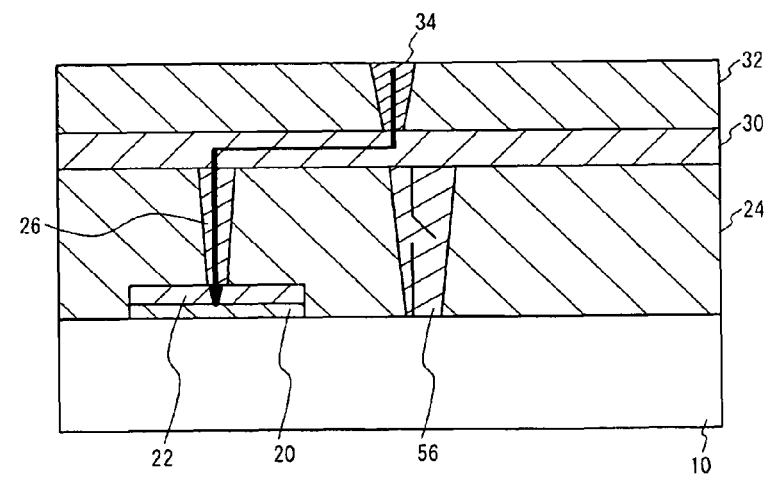

A second embodiment of the present invention pertains to a thermally variable resistive structure that is conductive with a gate electrode during the manufacturing of a flash memory but becomes non-conductive when the flash memory is in use. FIGS. 7(a) through 7(c) are cross-sectional views of a flash memory in accordance with the second embodiment. In FIGS. 7(a) through 7(c), only a single memory cell is shown, and some of the components are omitted. The single cell includes the semiconductor substrate 10, the wordline 22, the interlayer insulating film 24 and the metal plug 26. A thermally variable resistive or conductive structure (TVRS or TVCS) 56 is formed through the interlayer insulating film 24. An interconnection layer 30 is formed above the interlayer insulating film 24, and is coupled with the metal plug 26 and the TVRS 56. More specifically, the TVRS 56 is connected in parallel with the metal plug 26 between the interconnection layer 30 and the semiconductor substrate 10.

The TVRS 56 contains a material which is non-conductive at a temperature maintained during the operation of the flash memory (e.g., when a voltage is applied to the gate electrode), but becomes conductive at a higher temperature than the operational temperature. For example, flash memories generally operate at a temperature below 150 degrees Celsius. the manufacturing process, A wafer is usually processed at approximately 400 degrees Celsius during the manufacturing stage. Oxidized nickel (NiO) and cobalt oxide (CoO) are non-conductive at a resistivity of $10^4$ ohms-cm at temperatures below 150 degrees Celsius, but become conductive as phase displacements occur at 247 degrees Celsius. Therefore, a material which contains NiO or CoO may be used for the TVRS 56.

A dry etching process of the interconnection layer 30 is illustrated in FIG. 7(b). The temperature of the wafer during the process is approximately 400 degrees Celsius. Thus, the TVRS 56 conducts the electric charges electrifying the interconnection layer 30 to the semiconductor substrate 10 as indicated by an arrow. Accordingly, the word line 22 is not electrified.

FIG. 7(c) is an illustration showing the flash memory during its operation. On the interconnection layer 30, an interlayer insulating film 32 is formed. Then, a metal plug 34 is used to apply a voltage to the interconnection layer 30. Since the temperature is below 150 degrees Celsius during the operation, the TVRS 56 becomes non-conductive. Therefore, a voltage is applied to the word line 22 via the metal plug 34, the interconnection layer 30 and the metal plug 26.

Figure 8A:
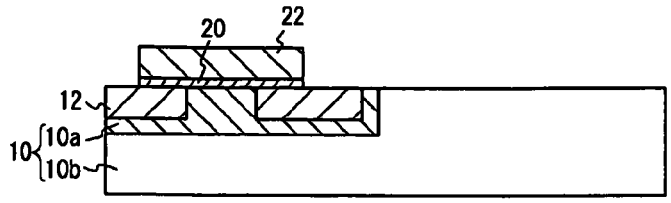
FIGS. 8(a) through 8(e) are illustrations showing a first half of a manufacturing process of the flash memory in accordance with the second embodiment.

FIGS. 8(a) through 9(d) illustrate a manufacturing process in accordance with the second embodiment. It is appreciated that only a single cell is illustrated in the figures although, in reality, multiple cells are simultaneously processed during the manufacturing or fabrication process. In FIG. 8(a), an ion implanted P-type well 10b is formed on the silicon semiconductor substrate 10. A N-type bit line 12 is formed in the P-type well 10b of the semiconductor substrate 10. On the semiconductor substrate 10, the ONO film 20 which includes the trapping layer 16 is formed. The word line 22 is formed on the ONO film 20.

Figure 8B:
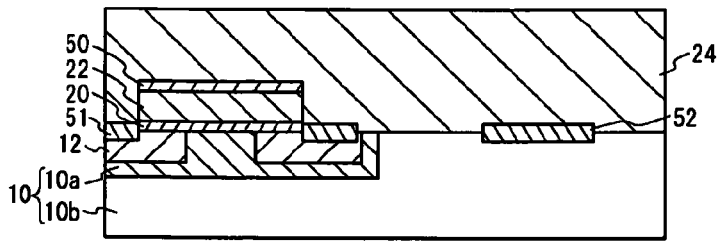

In FIG. 8(b), metal silicide layers 50, 51 and 52 are formed on the word line 22, on the bit line 12 and on the region of the semiconductor substrate 10 where the TVRS 56 would be formed. The metal silicide layers 50, 51 and 52 are formed by a heat treatment after metal layers (e.g., cobalt or titanium) are formed. On the semiconductor substrate 10 and on the metal silicide layers 50 to 52, an interlayer insulating film 24 (e.g., an oxide silicon layer) is formed using a TEOS method.

Figure 8C:
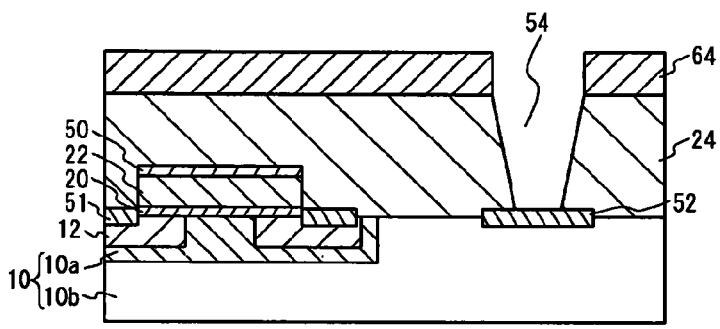
Figure 8D:
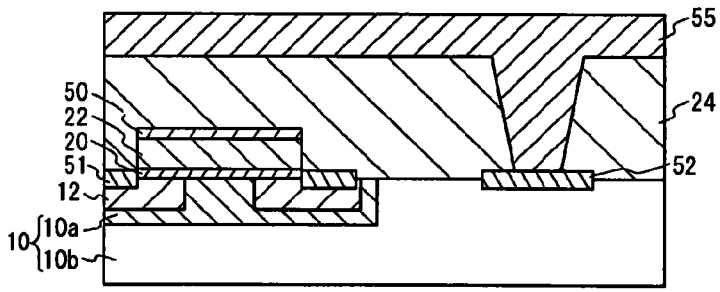
Figure 8E:
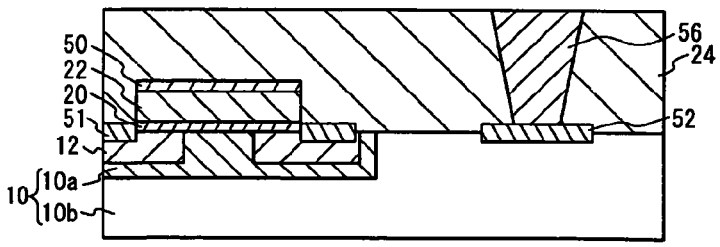

In FIG. 8(c), a photoresist 64 having an opening is formed on the interlayer insulating film 24. A contact hole 54 for the TVRS 56 which is coupled with the metal silicide layer 52 is formed by etching the interlayer insulating film 24 using the photoresist 64 as a mask. In FIG. 8(d), the photoresist 64 is removed. Using a sputtering method, a layer of, for example, NiO or CoO is formed inside the contact hole 54. In FIG. 8(e), the layer of NiO or CoO on the interlayer insulating film 24 is removed using a CMP method. Accordingly, the TVRS 56 is formed via the interlayer insulating film 24.

Figure 9A:
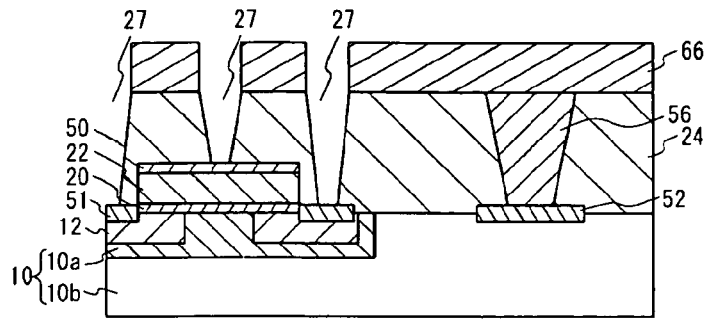
FIGS. 9(a) through 9(d) are illustrations showing a second half of the manufacturing process of the flash memory in accordance with the second embodiment.
Figure 9B:
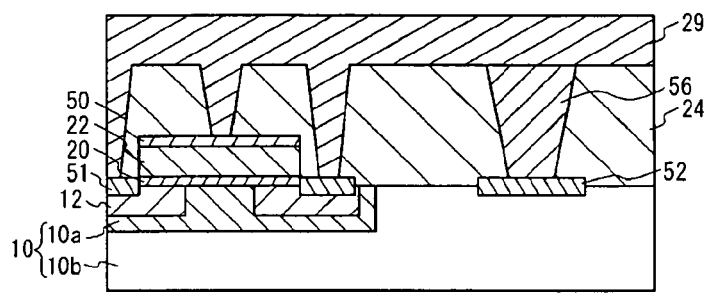
Figure 9C:
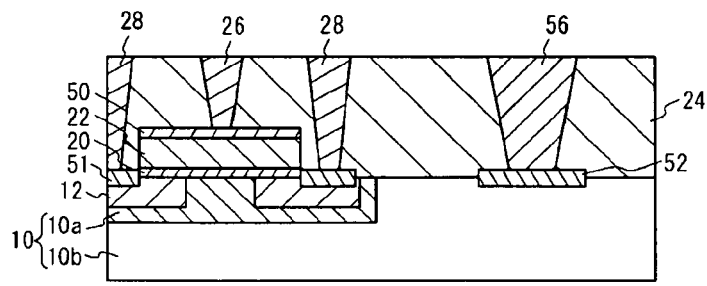
Figure 9D:
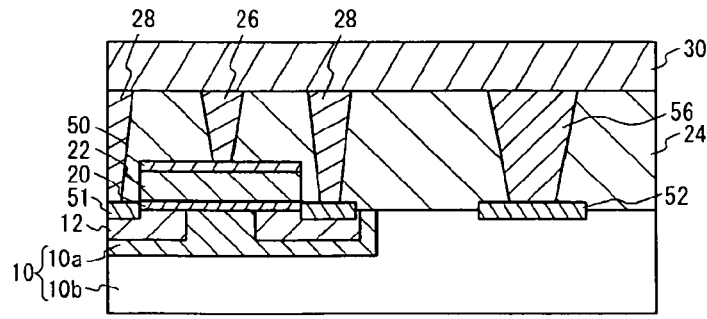

In FIG. 9(a), a photoresist 66 having one or more openings is formed on the interlayer insulating film 24. A contact hole 27 is formed by etching the interlayer insulating film 24 using the photoresist 66 as a mask. The contact hole 27 is used to form metal plugs 26 and 28 which are coupled with the metal silicide layers 50 and 51. In FIG. 9(b), the photoresist 66 is removed. Using a sputtering method, a layer of, for example, Ti/TiW and W is formed inside the contact holes 27. In FIG. 9(c), the layer of Ti/TiW and W on the interlayer insulating film 24 is removed using a CMP method. Accordingly, the metal plugs 28 and 26 are coupled with the bit line 12 and the word line 22, respectively. In FIG. 9(d), an interconnection layer 30, which is in contact with the TVRS 56 and the metal plugs 26 and 28, is formed on the interlayer insulating film 24 by forming a metal layer (e.g., aluminum) and by dry etching predefined regions.

The flash memory in accordance with the second embodiment, as illustrated in FIG. 7(a), includes the TVRS 56 which is coupled with the word line 22 via the metal plug 26 and the interconnection layer 30. As illustrated in FIG. 7(c), when the flash memory is operational, the TVRS 56 is non-conductive.

In an alternative embodiment, the TVRS 56 may be directly coupled with the word line 22. However, it is preferable to connect the TVRS 56 between the interconnection layer 30 and the semiconductor substrate 10 in parallel with the metal plug 26. Since the TVRS 56 is formed longitudinally, the size of the flash memory chip may be reduced.

As illustrated in FIGS. 8(e) and 9(c), it is preferable to form the TVRS 56 in the interlayer insulating film 24 before the metal plug 26 is formed. Since the word line 22 is not electrified during the formation of the TVRS 56, the accumulation of electric charges in the charge storage layer is further reduced.

As described herein, the TVRS 56 may be formed in the shape of the upside down trapezoid inside the contact hole 54. Alternatively, the shape of the TVRS 56 may be a rectangle. The rectangular fuse may work better when the voltage or current flowing through it is large. Since the TVRS 56 is closer to the surface of the interlayer insulating film 24 which is exposed to plasma and whose temperature tends to raise easily, the TVRS 56 is sure to become conductive.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device comprising:
   a wordline;
   a common ground line; and
   a fuse structure directly contacting the wordline and the common ground line to electrically couple the wordline and the common ground line, wherein the wordline and the common ground line are electrically uncoupled when the fuse structure receives a break signal.

2. The semiconductor device of claim 1, wherein the fuse structure comprises a non-doped silicon layer and a metal silicide formed on the non-doped silicon layer.

3. The semiconductor device of claim 2, wherein the metal silicide comprises one of cobalt silicon and titanium silicon.

4. The semiconductor device of claim 1, wherein the common ground line comprises a doped-silicon layer and a metal silicide formed above the doped-silicon.

5. The semiconductor device of claim 1, wherein the wordline is coated with a metal silicide.

6. The semiconductor device of claim 1, further comprising:
   an interlayer insulating layer formed above the wordline, the fuse structure, and the common ground line;
   an interconnect layer formed above the interlayer insulating layer; and
   a metal plug electrically coupling the interconnect layer with the wordline, the fuse structure and the common ground.

7. The semiconductor device of claim 1, wherein the break signal comprises a voltage signal between 2.5 volts and 5 volts or a current signal between 10 mA and 20 mA.

* * * * *